(12) United States Patent
Liu

(10) Patent No.: US 11,784,059 B2
(45) Date of Patent: Oct. 10, 2023

(54) METHOD FOR PREPARING SEMICONDUCTOR SAMPLE WITH ETCHED PIT SUITABLE FOR MICROSCOPE OBSERVATION

(71) Applicant: CHANGXIN MEMORY TECHNOLOGIES, INC., Hefei (CN)

(72) Inventor: Ming-Te Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 254 days.

(21) Appl. No.: 17/392,418

(22) Filed: Aug. 3, 2021

(65) Prior Publication Data

US 2022/0093410 A1     Mar. 24, 2022

Related U.S. Application Data

(63) Continuation of application No. PCT/CN2021/099859, filed on Jun. 11, 2021.

(30) Foreign Application Priority Data

Sep. 23, 2020   (CN) .......................... 202011007390.7

(51) Int. Cl.
*H01L 21/311* (2006.01)
*H01L 21/02* (2006.01)

(52) U.S. Cl.
CPC .... *H01L 21/31111* (2013.01); *H01L 21/0206* (2013.01)

(58) Field of Classification Search
CPC .. H01L 21/31111; H01L 21/0206; G01N 1/32

USPC .................................................. 438/745, 756
See application file for complete search history.

(56) References Cited

U.S. PATENT DOCUMENTS

| | | | |
|---|---|---|---|
| 6,121,156 A * | 9/2000 | Shamble | H01L 21/76802 |
| | | | 257/E21.507 |
| 6,593,231 B2 | 7/2003 | Endoh | |
| 6,616,784 B2 | 9/2003 | Chang | |
| 2002/0104612 A1 | 8/2002 | Chang | |
| 2002/0137350 A1 | 9/2002 | Endoh | |
| 2011/0048625 A1 * | 3/2011 | Caldwell | C01B 32/194 |
| | | | 156/233 |

(Continued)

FOREIGN PATENT DOCUMENTS

| | | | |
|---|---|---|---|
| CN | 100521117 C * | 7/2009 | G11C 17/12 |
| CN | 101865676 A | 10/2010 | |

(Continued)

*Primary Examiner* — Duy Vu N Deo
(74) *Attorney, Agent, or Firm* — Cooper Legal Group, LLC

(57) ABSTRACT

A method for preparing a semiconductor sample with an etched pit suitable for microscope observation is provided, including that a semiconductor sample piece is provided, the semiconductor sample piece including a sacrificial layer and a supporting layer which are stacked, and a trench which penetrates through the sacrificial layer and the supporting layer to expose a pit on a surface of a bottom metal layer; the semiconductor sample piece is steeped by placing it in an etching solution to remove the sacrificial layer; an adhesive tape is pasted on the surface of the semiconductor sample piece after the sacrificial layer is removed; and the adhesive tape is torn to remove the supporting layer above the pit to expose the pit.

10 Claims, 7 Drawing Sheets

(56) References Cited

U.S. PATENT DOCUMENTS

2019/0232631 A1* 8/2019 Cong .................... B82Y 40/00

FOREIGN PATENT DOCUMENTS

| CN | 101944562 A | 1/2011 |
|----|-------------|--------|
| CN | 102082069 A | 6/2011 |
| JP | 2001230232 A | 8/2001 |
| TW | 494449 B | 7/2002 |

* cited by examiner

A semiconductor sample piece is provided, the semiconductor sample piece includes a sacrificial layer and a supporting layer which are stacked, and a trench which penetrates through the sacrificial layer and the supporting layer to expose a pit on the surface of a bottom metal layer The semiconductor sample piece is steeped by placing it in an etching solution to remove the sacrificial layer An adhesive tape is pasted on the surface of the semiconductor sample piece after the sacrificial layer is removed The adhesive tape is torn to remove the supporting layer above the pit to expose the pit

FIG. 1

METHOD FOR PREPARING SEMICONDUCTOR SAMPLE WITH ETCHED PIT SUITABLE FOR MICROSCOPE OBSERVATION

CROSS-REFERENCE TO RELATED APPLICATIONS

The present application is a U.S. continuation application of International Application No. PCT/CN2021/099859, filed on Jun. 11, 2021, which claims priority to Chinese Patent Application No. 202011007390.7, filed on Sep. 23, 2020. International Application No. PCT/CN2021/099859 and Chinese Patent Application No. 202011007390.7 are incorporated herein by reference in their entireties.

TECHNICAL FIELD

The present application relates to the technical field of semiconductors, and specifically to a method for preparing a semiconductor sample with an etched pit suitable for microscope observation.

BACKGROUND

In a semiconductor manufacturing procedure, deep trench etching is a key manufacturing procedure, and a high depth-to-width ratio results in poor etching uniformity. In order to precisely adjust to an appropriate etching parameter, an etching result is checked in a wide range which provides a very important basis for the adjustment, as a pit will appear on an etching bottom structure if the etching is in place. Therefore, by observing topography of an etched pit, analyzing an observation result, and adjusting the etching parameter, a better uniformity of the deep trench etching and a better etching effect will be resulted.

In the related art, a Scanning Electron Microscope (SEM) is generally used to observe an etched semiconductor sample. Due to the limitation of the SEM observation apparatus, there are certain requirements for the thickness of a sample used for SEM observation. In order to make the observation more clear, the etched semiconductor sample needs to be processed to prepare a semiconductor sample suitable for the SEM observation. The conventional SEM sample preparation generally employs a grinding technique to grind away redundancy, for example, a part of a structure above the pit. A manner of the grinding technique is that the semiconductor sample is continuously ground from top to bottom and is repeatedly observed by the SEM. Plenty of time is needed to avoid grinding position inaccuracy or excessive grinding, so that the preparation of an SEM pit sample is complicated in process and low in efficiency.

SUMMARY

The present application aims to provide a method for preparing a semiconductor sample with for microscope observation. The method is simple and greatly reduces preparation time.

In order to solve the above technical problems, the present application provides a method for preparing a semiconductor sample with an etched pit suitable for microscope observation. The method includes that a semiconductor sample piece is provided, the semiconductor sample piece includes a sacrificial layer and a supporting layer which are stacked, and a trench which penetrates through the sacrificial layer and the supporting layer to expose a pit on a surface of a bottom metal layer; the semiconductor sample piece is steeped by placing the semiconductor sample piece in an etching solution to remove the sacrificial layer; an adhesive tape is pasted on the surface of the semiconductor sample piece after the sacrificial layer is removed; and the adhesive tape is torn to remove the supporting layer above the pit to expose the pit.

BRIEF DESCRIPTION OF THE DRAWINGS

FIG. 1 is a flow chart of a method for preparing a semiconductor sample with an etched pit suitable for microscope observation according to an embodiment of the present application.

FIG. 7 is a more clear and stereoscopic SEM picture of a semiconductor sample prepared according to a method for preparing a semiconductor sample with an etched pit suitable for microscope observation in an embodiment of the present application, which is obtained by an SEM at an acceleration voltage of 3 kV after operations of adjusting an observation angle of the semiconductor sample, using pattern detection and acquisition devices, and reducing scanning speed, and the like.

REFERENCE NUMERALS

Figure 2:
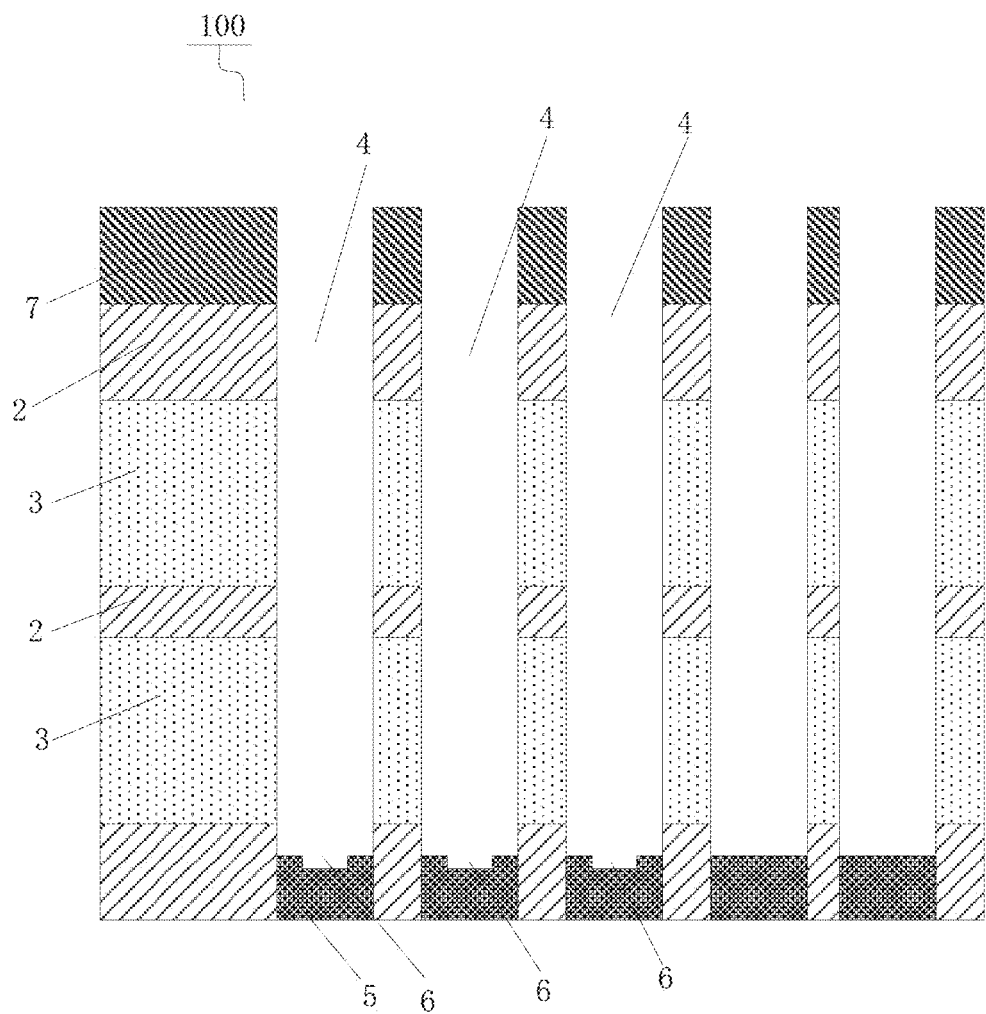
FIG. 2 to FIG. 5 are cross-sectional views of various operations in a procedure of a method for preparing a semiconductor sample with an etched pit suitable for microscope observation according to an embodiment of the present application.

100: semiconductor sample piece, 200: semiconductor sample formed after preparation, 2: supporting layer, 3: sacrificial layer, 4: trench, 5: bottom metal layer, 6: pit, and 7: mask layer.

DETAILED DESCRIPTION

A method for preparing a semiconductor sample with an etched pit suitable for microscope observation proposed by the present application is described in further detail below in combination with the accompanying drawings and detailed description.

In a manufacturing procedure of a semiconductor device, deep trench etching is a key manufacturing procedure. However, a high depth-to-width ratio leads to poor etching uniformity. There is a possibility that some semiconductor devices are not etched in place, and some semiconductor devices are over-etched. In order to precisely adjust to an appropriate etching parameter, Physical Failure Module Analysis (PFA) needs to be performed on the semiconductor device. An analysis result provides a very important basis for subsequent parameter adjustment. A pit will appear on an etching bottom structure if the etching is in place. By observing the semiconductor sample piece having a pit with an electron microscope, the etching parameter can be precisely adjusted according to an observation result of the electron microscope so as to provide a reference for the preparation of deep trench etching of the semiconductor device.

In the related art, when the semiconductor sample piece suitable for electron microscope observation is prepared, the surface of the semiconductor device is mainly repeatedly ground to the thickness with which the pit at the bottom can be observed by the electron microscope. However, the grinding strength of each person is different and the grinding time cannot be quantified, so that the grinding depth needs to be confirmed by entering the microscope many times, and plenty of time is taken. In addition, after the grinding, the grinding degree of each region is different, and more time is needed to find an available region when entering the electron microscope, so that the preparation time of the semiconductor sample is long and the efficiency is low.

A method for preparing a semiconductor sample with an etched pit suitable for microscope observation according to the embodiment of the present application is described below with reference to the accompanying drawings. It is to be noted that the microscope here may be an electron microscope, for example, an SEM or a transmission electron microscope, and the like.

As shown in FIG. 1, the method for preparing a semiconductor sample with an etched pit suitable for microscope observation according to an embodiment of the present application may include the following operations. A semiconductor sample piece 100 is provided. The semiconductor sample piece 100 includes a sacrificial layer 3 and a supporting layer 2 which are stacked, and a trench 4 which penetrates through the sacrificial layer 3 and the supporting layer 2 to expose a pit 6 on the surface of a bottom metal layer 5. The semiconductor sample piece 100 is steeped by placing the semiconductor sample piece in an etching solution to remove the sacrificial layer 3. An adhesive tape is pasted on the surface of the semiconductor sample piece 100 after the sacrificial layer 3 is removed. The adhesive tape is torn to remove the supporting layer 2 above the pit 6 to expose the pit 6.

FIG. 2 to FIG. 5 are cross-sectional views of various operations in a preparation procedure of a semiconductor sample piece 100 with an etched pit 6 suitable for a microscope.

As shown in FIG. 2, the semiconductor sample piece 100 is provided. The semiconductor sample piece 100 may be a semiconductor device subjected to deep trench etching in a procedure. The pit 6 is formed at the bottom of the semiconductor sample piece 100 after etching.

Specifically, the semiconductor sample piece 100 includes a stacked structure formed by the sacrificial layer 3 and the supporting layer 2 which are stacked. There may be multiple sacrificial layers 3 and multiple supporting layers 2. The multiple sacrificial layers 3 and the multiple supporting layers 2 are overlapped. For example, as shown in FIG. 2, there may be two sacrificial layers 3, there may also be two supporting layers 2, and the two sacrificial layers 3 and the two supporting layers 2 are alternately disposed. The sacrificial layer 3 may be an oxide layer, for example, a silicon oxide layer, and the supporting layer 2 may be a nitride layer, for example, a silicon nitride layer.

The semiconductor sample piece 100 further includes the bottom metal layer 5. The trench 4 penetrating through the bottom stacked structure is formed in the stacked structure to expose the bottom metal layer 5. When the stacked structure is etched, the pit 6 will be formed on the surface of the bottom metal layer 5. The pit 6 is observed by the electron microscope. An etching parameter can be adjusted according to an observation result to improve an etching effect.

Figure 3:
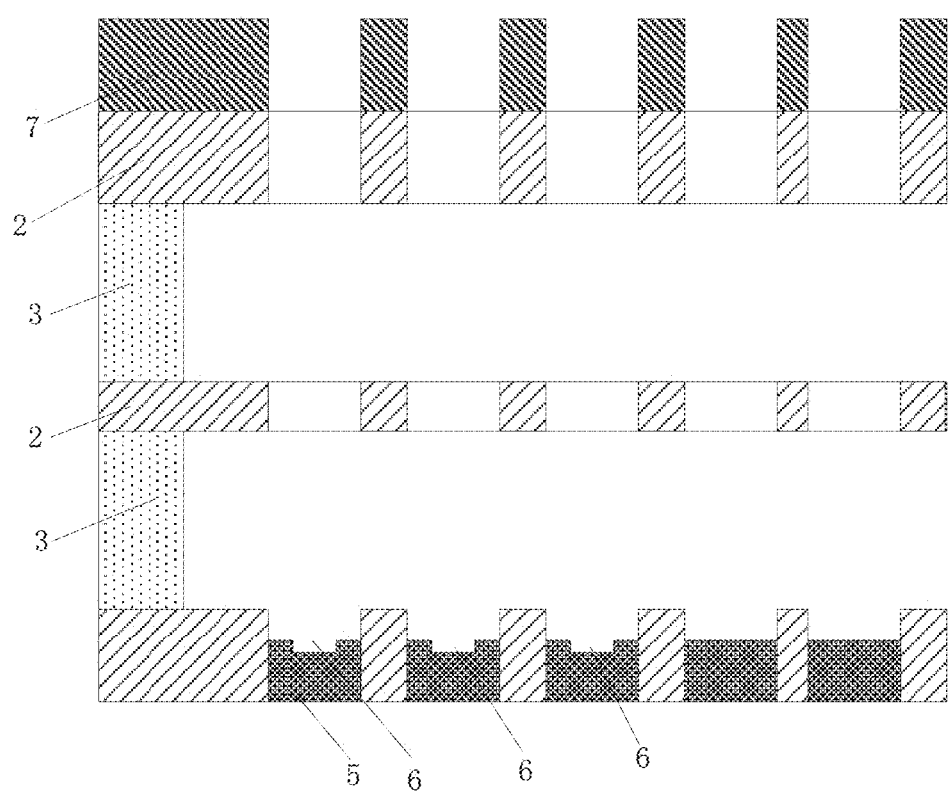

As shown in FIG. 3, the semiconductor sample piece 100 is steeped by placing the semiconductor sample piece in the etching solution to remove the sacrificial layer 3. The sacrificial layer 3 is removed after steeping corrosion of the etching solution, while the supporting layer 2 is reserved. The residual supporting layer 2 is located above the pit 6, so that the pit 6 still cannot be observed by the electron microscope.

Further, after the semiconductor sample piece 100 is steeped by the etching solution, the sacrificial layer 3 located right above the pit 6 can be substantially completely removed, and the sacrificial layer 3 located above a side of the pit 6 is also partially consumed, so that the layered structure above the pit 6 can be removed more thoroughly, and the subsequent pit 6 can be observed more clearly. Optionally, the thickness of the removed sacrificial layer 3 after acid steeping is 50% to 70% of the total thickness of the sacrificial layer 3. As shown in combination with FIG. 3 to FIG. 5, the sidewall sacrificial layer 3 located above a side of above the bottom metal layer 5 is partially consumed, and the etching solution enters through the trench 4 and etches the sacrificial layer 3. As a result, the consumed thickness of the sidewall sacrificial layer 3 along a horizontal direction is 50% to 70% of the total thickness of the sidewall sacrificial layer 3 along the horizontal direction.

Figure 4:
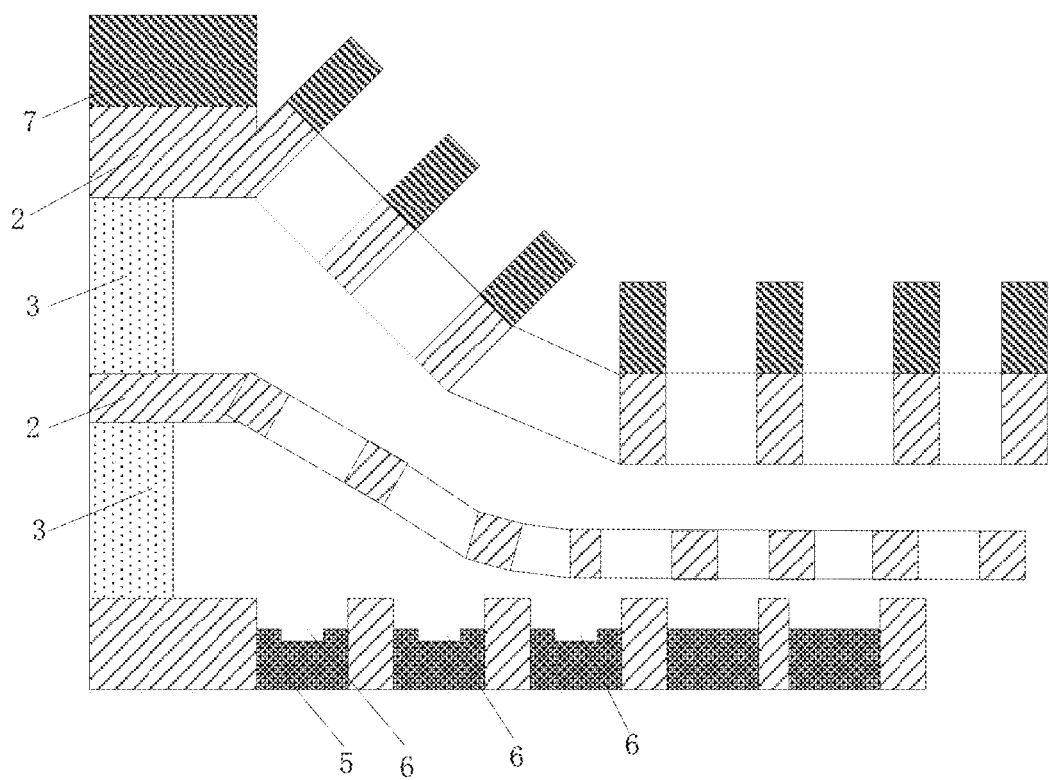
Figure 5:
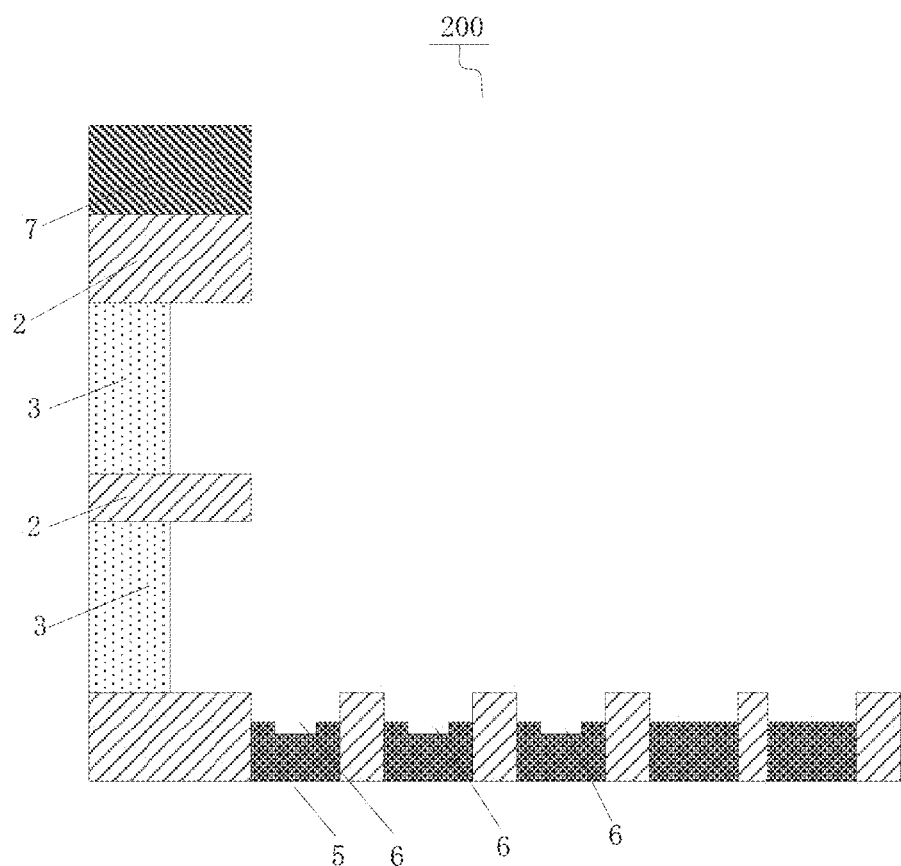

As shown in combination with FIG. 4 and FIG. 5, the adhesive tape may be pasted on the surface of the semiconductor sample piece 100 after the sacrificial layer 3 is removed. The adhesive tape may be pasted on the upper surface of the semiconductor sample piece 100, so that structures (for example, the supporting layer 2 and the like) pasted to the adhesive tape can also be removed when the adhesive tape is torn, and therefore. As shown in FIG. 5, an obstructing object above the pit 6 can be removed to expose the pit 6. The pit 6 can be directly and clearly observed by the electron microscope, so that the sample piece preparation of the electron microscope is achieved.

As shown in FIG. 4, since the sacrificial layer 3 is removed, an upper structure of the semiconductor sample piece 100 cannot be supported, and the remaining supporting layer 2 after etching will collapse, so that the supporting layer 2 and a mask layer 7 on the top thereof may collapse and overlap together, and the observation of the etched pit is easily hindered. By subsequent adhesive tape pasting, however, the structure where each layer of the supporting layer 2 and the mask layer 7 is overlapped can be pasted and removed together.

With regard to the etching solution for steeping the semiconductor sample piece 100 to remove the sacrificial layer 3, the only requirement is to remove the sacrificial layer 3 without damaging a shape of the pit 6 at the bottom. For example, the etching solution may be at least one of a hydrofluoric acid solution or a nitric acid solution. In other words, the etching solution may be the hydrofluoric acid solution or the nitric acid solution, and may also be a mixed solution of the hydrofluoric acid solution and the nitric acid solution. Optionally, the etching solution may be the hydrofluoric acid solution. The concentration of the hydrofluoric acid solution may be 40% to 55%, for example, the concentration of the hydrofluoric acid solution may be 42%, 45%, 48%, 49%, or 50%, and the like. Not only the sacrificial layer 3 can be removed effectively, but also damage to the pit 6 of the bottom metal layer 5 and the supporting layer 2 can be avoided.

The steeping temperature of the semiconductor sample piece 100 may be 20° C. to 25° C., and the steeping time may be 20 s to 40 s. Further, the time for steeping the semiconductor sample piece 100 to remove the sacrificial layer 3 may be 20 s, 25 s, 30 s, or 35 s, and the like. The specific time can be set according to the size and the specific type of the semiconductor sample piece 100 and the layer number and thickness of the sacrificial layer 3.

When the structures (for example, the supporting layer 2 and the like) above the pit 6 are removed by adhesive tape pasting and tearing, the adhesive tape may be pasted and torn several times to remove the structures (for example, the supporting layer 2 and the like) above the pit 6, that is, the adhesive tape pasting and tearing may be performed several times. As shown in FIG. 4, after the sacrificial layer 3 is removed, the supporting layer 2 located above the pit 6 is liable to collapse due to lack of support of the sacrificial layer 3. The multiple supporting layers 2 can be removed by repeatedly adhesive tape pasting and tearing. Also, the adhesive tape has certain adhesiveness, and adhesive liquid of the adhesive tape enters a gap of the supporting layer 2 and can paste the supporting layer 2 structure below, so that the supporting layer 2 structure is removed quickly and efficiently.

Therefore, according to the preparation method of a semiconductor sample with an etched pit suitable for microscope observation of the embodiment of the present application, the supporting layer 2, the sacrificial layer 3, and the like above the pit 6 are removed by an acid steeping and adhesive tape pasting method. The method is simple, and the acid steeping and adhesive tape pasting and tearing time is short, for example, the steeping time may be about 30 s, and the time for pasting and tearing the adhesive tape to remove the supporting layer 2 is about 20 s. The method is applicable to batch preparation without observing many times and grinding repeatedly by using the microscope. Compared with the repeated observation and continuous grinding time of the related art (about 60 minutes per piece) and the fact that multiple pieces cannot be processed simultaneously, the preparation method of the present application has the advantage that the preparation time of the semiconductor sample 200 with etched pit for electron microscope observation is greatly reduced.

Optionally, the adhesive tape may be a blue tape. The blue tape is an electronic level adhesive tape. The adhesive tape can be used to protect a front surface of a wafer in preparation procedures (for example, grinding, cutting, conveying, and the like), protect the front surface of the wafer from damage during grinding, and absorb impact force during grinding to ensure that the wafer will not break. When cutting is performed, a crystal grain can be fixed on the adhesive tape, and a phenomenon of crystal grain loss is avoided. The cutting quality and the convenience for taking the crystal grain are improved. The characteristic that adhesive is not liable to remain is also achieved. Therefore, by blue tape pasting, not only the residual supporting layer 2 and the like located above the pit 6 can be removed, but also the pit 6 can be prevented from damage, and residual adhesive also can be prevented from forming above the pit 6 to influence the observation result of the pit 6.

In some embodiments, before the operation that an adhesive tape is pasted on the surface of the semiconductor sample piece 100 after the sacrificial layer 3 is removed, the following operation may also be performed. The steeped semiconductor sample piece 100 is cleaned, for example, overflow washing may be performed by using a chemical solution with a certain proportion to remove the etching solution and reaction residues remained on the surface of the semiconductor sample piece 100, thereby facilitating an operation of a subsequent process. The cleaned semiconductor sample piece 100 is dried, thereby facilitating the pasting of the subsequent adhesive tape to remove the structures, for example, the surface supporting layer 2 and the like.

Further, the semiconductor sample piece 100 further includes a mask layer 7 for forming the trench 4 with a pattern. The mask layer 7 is formed on the surface of the top supporting layer 2. That is, the mask layer 7 does not need to be removed in the procedure of etching the semiconductor sample piece 100 to form the pit 6; the mask layer 7 is removed when the semiconductor sample piece 100 suitable for electron microscope observation is prepared. The preparation time of the semiconductor sample 200 can be further reduced, and the steps of the preparation process are reduced. Specifically, after the semiconductor sample piece 100 is steeped to remove the sacrificial layer 3, the mask layer 7 on the surface of the top supporting layer 2 can be removed by adhesive tape pasting and tearing.

An electron microscope observation method of a semiconductor sample 200 prepared according to a method for preparing a semiconductor sample with an etched pit suitable for microscope observation of an embodiment of the present application is described below. An SEM is taken as an example below.

An advanced observation method of a semiconductor sample with etched pit by an SEM according to the embodiment of the present application includes the following operations.

Figure 6:
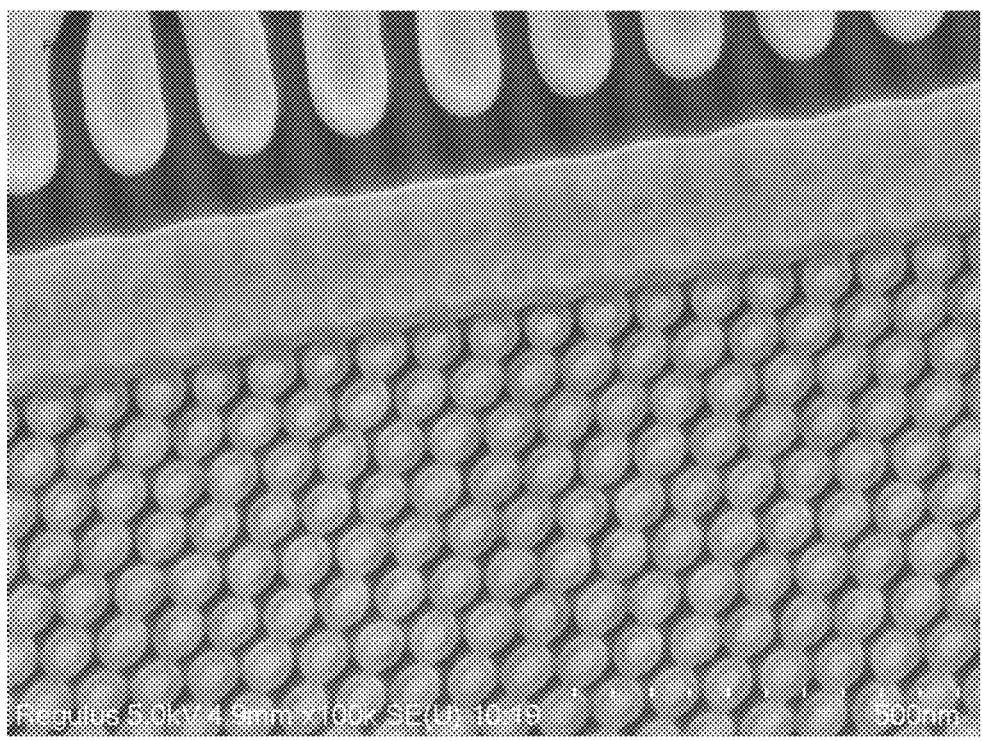
FIG. 6 is a topography picture of a semiconductor sample prepared according to a method for preparing a semiconductor sample with an etched pit suitable for microscope observation in an embodiment of the present application, which is observed by an SEM at an acceleration voltage of 5 kV.
Figure 7:
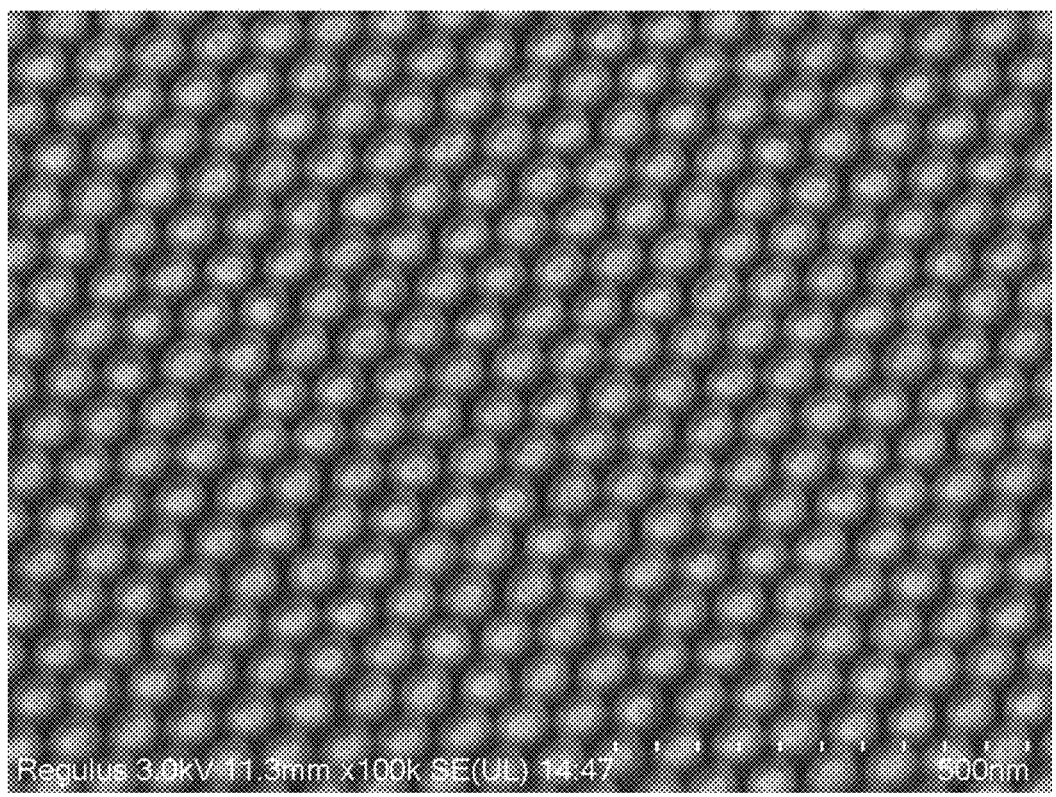

An acceleration voltage is adjusted at the acceleration voltage of 5 kV to 3 kV. Specifically, the higher the acceleration voltage is, the smaller the beam spot diameter is. In an SEM, a finer surface topography pattern is generally obtained at a low acceleration voltage. An electron beam penetration and diffusion region becomes larger at a high acceleration voltage; this results in the generation of superfluous signals from the inside of the sample piece, reduction of contrast of an image, and shielding of fine surface topography. Therefore, in an observation procedure, the acceleration voltage is adjusted from high to low. For example, the maximum acceleration voltage may be set as 5 kV, and the minimum acceleration voltage may be adjusted to 3 kV. In this way, the acceleration voltage is adjusted from 5 kV to 3 kV. A large region of semiconductor sample 200 can be observed at a high voltage so as to locate a target position. With the decrease of the acceleration voltage, the observed target position of the observation sample piece become clearer, so that more surface information of the semiconductor sample 200 can be obtained. For example, as shown in FIG. 6 and FIG. 7, FIG. 6 is a topography picture of a semiconductor sample observed by using an SEM at an acceleration voltage of 5 kV when no other observation adjustment is performed. FIG. 7 is a clearer and more stereoscopic SEM picture of the semiconductor sample, which is obtained by using the SEM at an acceleration voltage of 3 kV after operations of adjusting an observation angle of the semiconductor sample, using multiple pattern detection and acquisition devices, reducing scanning speed, and the like.

The observation angle of an SEM is adjusted to obtain a three-dimensional pattern of the observed semiconductor sample 200. Optionally, the adjustment angle of an SEM is not greater than 30 degrees, for example, when the SEM is located right above the semiconductor sample 200, the observation angle of the SEM is defined as 0 degree, and the observation angle for the SEM to observe the semiconductor sample 200 is adjusted by rotating a scanning lens or adjusting a position of the sample. The adjusted observation angle is smaller than or equal to 30 degrees.

The semiconductor sample is observed by using multiple image detection and acquisition devices to further obtain three dimensional information of the semiconductor sample (for example, topography), so that more information of the semiconductor sample 200 can be obtained. For example, two image detection and acquisition devices may be used for image acquisition. One image detection and acquisition device is located above the semiconductor sample 200 or is located diagonally above the semiconductor sample 200, and the other image detection and acquisition device may be located below the semiconductor sample 200 or is located diagonally below the semiconductor sample 200 so as to observe the semiconductor sample 200 from different angles to obtain more information of the surface of the semiconductor sample 200.

The scanning speed is adjusted. When the semiconductor sample 200 is scanned and observed, the scanning speed may be adjusted to be low, that is, the scanning speed is adjusted to be relatively slow, so that more information of the semiconductor sample 200 is further obtained.

For the prepared semiconductor sample 200, before the semiconductor sample 200 is observed by an SEM, the surface of the semiconductor sample 200 may be plated with a layer of metal, that is, the surface of the semiconductor sample 200 is plated with a metal layer, for example, a platinum (Pt) layer, a gold layer, a silver layer and the like, so that the conductivity of the surface of the semiconductor sample 200 can be improved, the charge effect is eliminated, and the transfer of an electronic signal caused by charge aggregation is avoided, thereby improving an observation effect of the semiconductor sample 200.

Some hydrocarbons exist in a sample region of an SEM, and charged carbon ions will be formed after being bombarded by an electron beam. When the sample is observed by an SEM, the electron beam scans in a micro-region so that electrons in the region to be relatively enriched, and the carbon ions are enriched and deposited to the region, thereby influencing the generation of secondary electron signals in the region. After one region is observed for a period of time, obvious carbon deposition appears on the surface of a sample, a carbon layer is formed, thereby influencing photographing effect of the sample. The carbon layer deposited in an SEM may be removed before the sample is observed, for example, plasma cleaning processing may be performed on the sample of the SEM for 2 to 4 minutes to remove the deposited carbon layer. Further, the plasma cleaning processing may be performed for 3 minutes to improve the observation effect of an SEM.

The above description is merely preferred embodiments of the present application. It is to be pointed out that those of ordinary skill in the art may further make multiple improvements and modifications without departing from a principle of the present application and those improvements and modifications also should be considered as the protection scope of the present application.

INDUSTRIAL APPLICABILITY

In the embodiment of the present application, a semiconductor sample piece is provided, the semiconductor sample piece includes a sacrificial layer and a supporting layer which are stacked, and a trench which penetrates through the sacrificial layer and the supporting layer to expose a pit on a surface of a bottom metal layer; the semiconductor sample piece is steeped by placing the semiconductor sample piece in an etching solution to remove the sacrificial layer; an adhesive tape is pasted on the surface of the semiconductor sample piece after the sacrificial layer is removed; and the adhesive tape is torn to remove the supporting layer above the pit to expose the pit. By doing so, the method is simple in preparation and greatly reduces the preparation time of a semiconductor sample with the etched pit suitable for microscope observation.

The invention claimed is:

1. A method for preparing a semiconductor sample with an etched pit suitable for microscope observation, comprising:
    providing a semiconductor sample piece, the semiconductor sample piece comprising a sacrificial layer and a supporting layer which are stacked, and a trench which penetrates through the sacrificial layer and the supporting layer to expose a pit on a surface of a bottom metal layer;
    steeping the semiconductor sample piece by placing the semiconductor sample piece in an etching solution to remove the sacrificial layer;
    pasting an adhesive tape on a surface of the semiconductor sample piece after the sacrificial layer is removed; and
    tearing the adhesive tape to remove the supporting layer above the pit to expose the pit.

2. The method of claim 1, wherein the etching solution is at least one of a hydrofluoric acid solution or a nitric acid solution.

3. The method of claim 2, wherein the etching solution is hydrofluoric acid solution with a concentration of 40% to 55%.

4. The method of claim 1, wherein said steeping the semiconductor sample piece by placing the semiconductor sample piece in an etching solution to remove the sacrificial layer is performed for steeping time of 20 s to 40 s.

5. The method of claim 1, wherein said steeping the semiconductor sample piece by placing the semiconductor sample piece in an etching solution to remove the sacrificial layer is performed at steeping temperature of 20° C. to 25° C.

6. The method of claim 1, wherein the adhesive tape is a blue tape.

7. The method of claim 1, wherein after said placing the semiconductor sample piece in an etching solution for steeping to remove the sacrificial layer, and before said pasting an adhesive tape on a surface of the semiconductor sample piece after the sacrificial layer is removed, the method further comprises:
    cleaning the steeped semiconductor sample piece; and
    drying the cleaned semiconductor sample piece.

8. The method of claim 1, wherein the semiconductor sample piece further comprises a mask layer for patterning, the mask layer is formed on a surface of a top supporting layer, and the mask layer is removed when tearing the adhesive tape to remove the supporting layer above the pit.

9. The method of claim 1, wherein a material of the sacrificial layer is silicon oxide.

10. The method of claim 9, wherein a material of the supporting layer is silicon nitride.

* * * * *